(12) United States Patent  
Makabe et al.

(10) Patent No.: US 6,707,735 B2
(45) Date of Patent: Mar. 16, 2004

(54) SEMICONDUCTOR MEMORY DEVICE

(75) Inventors: Ryu Makabe, Hyogo (JP); Masaki Tsukude, Hyogo (JP); Hirotoshi Sato, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/120,445

(22) Filed: Apr. 12, 2002

(65) Prior Publication Data

US 2002/0176297 A1 Nov. 28, 2002

(30) Foreign Application Priority Data

May 28, 2001 (JP) ........................... 2001-158603

(51) Int. Cl.[7] .................................................. G11C 7/00
(52) U.S. Cl. .......................................... 365/201; 365/222
(58) Field of Search ............................... 365/201, 222, 365/330.06, 230.08

(56) References Cited

U.S. PATENT DOCUMENTS

| 5,400,290 A | 3/1995 | Suma et al. | |
|---|---|---|---|
| 6,233,182 B1 | * 5/2001 | Satou et al. | 365/200 |
| 6,262,926 B1 | * 7/2001 | Nakai | 365/200 |
| 6,467,056 B1 | * 10/2002 | Satou et al. | 714/720 |

FOREIGN PATENT DOCUMENTS

| JP | 5-190624 | 7/1993 |
|---|---|---|
| JP | 10-247399 | 9/1998 |

* cited by examiner

*Primary Examiner*—Richard Elms
*Assistant Examiner*—Hien Nguyen
(74) *Attorney, Agent, or Firm*—McDermott, Will & Emery

(57) ABSTRACT

When address signal bits and/or data bits in a predetermined pattern are accessed a predetermined number of times successively, a test mode can be set. By using address signal bits and/or data bits as a test command for designating a test content, a test content is specified. A semiconductor memory device with an interface compatible with an interface of a normal static random access memory is provided.

16 Claims, 8 Drawing Sheets

: DIFFERENT IN TARGET FUNCTION

SEMICONDUCTOR MEMORY DEVICE

BACKGROUND OF THE INVENTION

1. Field of the Invention

The present invention relates to a semiconductor device having a plurality of kinds of operation contents and, particularly, to a configuration for setting a test mode of the semiconductor memory device. More particularly, the present invention relates to a configuration for a test mode entry for setting a test mode of a semiconductor memory device and, specifically, to a configuration for a test mode entry of a pseudo SRAM which operates similarly to an SRAM (Static Random Access Memory).

2. Description of the Background Art

In an application of a portable equipment, an SRAM is used as an internal memory because of its high processing speed and simple control. The memory cell of the SRAM is, however, constructed by four transistors and two load elements. Consequently, the occupying area of SRAM memory cell is large, and it is difficult to implement a memory of a large storage capacity in a limited area.

As the functions of a portable equipment are enhanced, it is necessary to process data of a larger amount such as image data and audio data. A memory of a large storage capacity is required for a memory device of the portable equipment. In the case of using an SRAM, it is difficult to implement the memory of the large storage capacity in a small occupying area, so that a demand of down sizing and lightening of high-function portable equipment cannot be met.

On the other hand, the memory cell of a dynamic random access memory (DRAM) is constructed of one transistor and one capacitor. The DRAM has therefore an advantage that the occupying area of the memory cell is smaller, as compared to the memory cell of the SRAM. The DRAM can be said to be suitable for constructing a memory of a large storage capacity with a small occupying area. The DRAM has a further advantage that the occupying area of the memory cell is smaller and a cost per bit is lower as compared with an SRAM.

However, since the DRAM stores data in the capacitor, in order to prevent the stored data from being lost by a leak current, refreshing operation for rewriting data has to be periodically performed. During execution of the refreshing operation, an external device such as a processor cannot access the DRAM and has to wait, so that the processing efficiency of the system deteriorates. There is another problem that the load for the refreshing control of an external memory controller is heavy.

The DRAM is held in a standby mode such as a sleep mode in a waiting time in a portable equipment or the like. Also in such a standby mode, however, stored data has to be held and refreshing has to be executed periodically. Therefore, an ultra low standby current condition of the order of $\mu A$ required in a specification or the like for an operation period for holding data such as a sleep mode cannot be satisfied.

In order to implement the memory of a large storage capacity with the small occupying area at low cost, a DRAM-based memory has to be used. In the case of using such a DRAM-based memory, called an SRAM alternative memory hereinbelow, the memory replacement has to be done without significantly changing a conventional system configuration. In other words, compatibility of pins is required. The "memory" indicates a memory device connected to a device such as an external processor via pin terminals.

The SRAM alternative memory is required to operate under the same operating conditions, or the same signal timings, as those of the SRAM.

In the case of fabricating the SRAM alternative memory, in order to assure the reliability, a product test has to be sufficiently performed. In the case of using a DRAM-based memory, however, different from a conventional DRAM, for the operation control signals, a chip enable signal CE#, a write enable signal WE#, and an output enable signal OE# have to be used in view of compatibility with an SRAM. Therefore, the configuration of using signals RAS, CAS, and WE to set a test mode in a conventional DRAM mode cannot be used.

In the case of designating a special operation mode of the SRAM alternative memory as well, similarly, a mode setting condition used in a conventional DRAM cannot be used as it is. In the SRAM alternative memory, a new configuration has to be provided to designate a special mode such as a test mode. The configuration for designating a special mode has to be formed using an interface having compatibility with an interface of an SRAM.

SUMMARY OF THE INVENTION

An object of the present invention is to provide a configuration for designating a special operation mode of an SRAM alternative memory.

Another object of the present invention is to provide an SRAM alternative memory capable of designating a test mode while maintaining compatibility with an SRAM.

Further object of the present invention is to provide a semiconductor memory device that can reliably enter a test mode without exerting an adverse influence on a normal operation mode.

A semiconductor device according to the present invention includes: determining circuitry for determining whether an external signal satisfies a predetermined condition or not; and internal state setting circuitry enabled when a determination result of the determining circuitry indicates that the predetermined condition is satisfied, for setting, in accordance with an internal state designation signal designating a specific operation content, an internal state to a state designated by the internal state designation signal.

When the external signal satisfies the predetermined condition, a mode capable of setting a specific mode of operation is set, and the operation content in the specific mode is designated. By setting the predetermined condition in accordance with signals used in a normal SRAM, the specific mode can be designated while maintaining the compatibility with an SRAM.

An operation content is set in the specific mode only when the predetermined condition is satisfied, so that the operation content in the specific mode can be set accurately.

By constructing such that a predetermined condition is determined to be satisfied when a specific condition is met a plurality of times successively, a semiconductor device can enter a specific mode under the condition which is not used in a normal mode of operation. Consequently, the semiconductor memory device can be prevented from entering the specific mode erroneously in the normal mode of operation. Thus, highly reliable setting of a specific mode can be implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
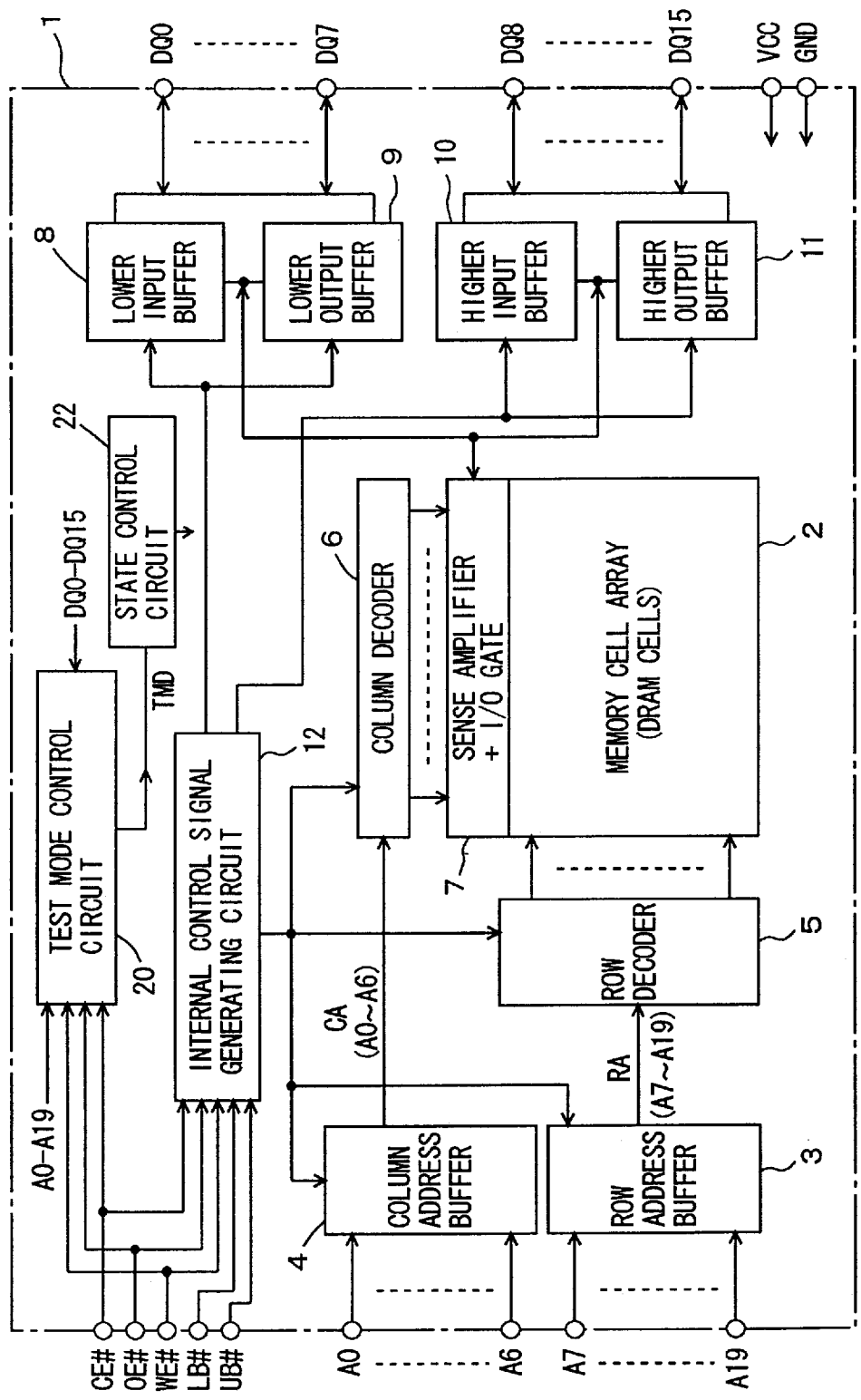
FIG. 1 is a diagram schematically showing an entire configuration of a semiconductor memory device according to a first embodiment of the invention.

FIG. 1 is a diagram schematically showing an entire configuration of a semiconductor memory device according to a first embodiment of the present invention. In FIG. 1, a semiconductor memory device 1 includes: a memory cell array 2 having a plurality of memory cells arranged in rows and columns; a row address buffer 3 for receiving address signal bits A7 to A19 from an outside of the memory device and generating an internal row address signal RA (A7 to A19); a column address buffer 4 for receiving address signal bits A0 to A6 applied externally and generating an internal column address signal CA; a row decoder 5 for decoding the internal row address signal RA and selecting a row in memory cell array 2 in accordance with the result of decoding; a column decoder 6 for decoding the internal column address signal CA and generating a column selection signal for selecting a column in memory cell array 2 in accordance with the result of decoding; a sense amplifier for sensing, amplifying and latching data of memory cells on the row selected by row decoder 5; and an I/O gate for connecting a selected column in memory cell array 2 to an internal data line (I/O line) in accordance with the column selection signal from column decoder 6. In FIG. 1, the sense amplifier and the I/O gate are indicated by a block 7.

Semiconductor memory device 1 further includes: a lower input buffer 8 for taking in lower byte data DQ0 to DQ7 in data writing operation; a lower output buffer 9 for externally outputting lower byte data DQ0 to DQ7 in data reading operation; a higher input buffer 10 for taking in upper byte data DQ8 to DQ15 and generating internal write data in data writing operation; a higher output buffer 11 for externally outputting upper byte data DQ8 to DQ15 in data reading operation; and an internal control signal generating circuit 12 for generating signals for controlling various internal operations in accordance with externally applied control signals, that is, a chip enable signal CE#, an output enable signal OE#, a write enable signal WE#, a lower byte enable signal LB#, and an upper byte enable signal UB#.

When chip enable signal CE# is at the L level, it indicates that semiconductor memory device 1 is selected, and semiconductor memory device 1 can be accessed. When output enable signal OE# is at the L level, a data reading mode is designated. When write enable signal WE# is at the L level, a data writing mode is designated. When lower byte enable signal LB# is at the L level, it indicates that lower byte data DQ0 to DQ7 is valid. When upper byte enable signal UB# is at the L level, it indicates that upper byte data DQ8 to DQ15 is valid.

Internal control signal generating circuit 12 controls the operations of row address buffer 3, column address buffer 4, row decoder 5, column decoder 6, and sense amplifier and I/O gate block 7 in accordance with chip enable signal CE#, output enable signal OE#, and write enable signal WE#.

Internal control signal generating circuit 12 further controls the activation/inactivation of lower input buffer 8, lower output buffer 9, higher input buffer 10, and higher output buffer 11 in accordance with upper byte enable signal UB# and lower byte enable signal LB# and the operation mode.

Semiconductor memory device 1 further includes: a test mode control circuit 20 for receiving control signals CE#, OE#, and WE#, address signal bits A0 to A19, and data bits DQ0 to DQ15 externally applied and setting the semiconductor memory device 1 into a test mode; and a state control circuit 22 for setting the internal state of semiconductor memory device 1 to a designated state in accordance with a test mode setting signal MD from test mode control circuit 20.

The configuration of test mode control circuit 20 will be described in detail later. When the semiconductor memory device 1 is accessed through an access sequence which is not used in a normal access mode, it is determined that a test mode for testing semiconductor memory device 1 is designated, and a mode for accepting signals (command) for designating a test to be performed in the test mode is set. A test content performed in the test mode is designated by the use of address signal bits. According to a combination of the address signal bits, an internal state setting signal (test mode designating signal) TMD is generated.

State control circuit 22 sets the internal state to, for example, a state of connecting an internal node to an external terminal or a state of simultaneously selecting memory cells of a plurality of bits in accordance with internal state setting signal (test mode designating signal) TMD from test mode control circuit 20. For the configuration of state control circuit 22, any configuration that can set an internal state to a state designated by a test instruction signal is employable. Therefore, state control circuit 22 can have any of various configurations such as a switch circuit, a gate circuit, and a selection circuit in accordance with the configuration of circuitry to be tested.

As shown in FIG. 1, in semiconductor memory device 1, chip enable signal CE#, output enable signal OE#, write enable signal WE#, upper byte enable signal UB#, and lower byte enable signal LB# are used as control signals. The control signals are the same as those used in a normal SRAM. Consequently, while maintaining the compatibility of pins, an SRAM alternative memory can be produced.

In memory cell array 2, a DRAM cell is used as a memory cell. Data stored in the memory cells in memory cell array 2 are refreshed by a fully hidden refresh method. Specifically, there is no refresh terminal for externally instructing refreshing and refreshing is executed internally in a hidden manner during a normal access. Thus, different from a normal DRAM, it is unnecessary to particularly provide a refresh mode for rewriting or restoring data by an external instruction. A memory having full compatibility with an SRAM can be implemented.

Figure 2:
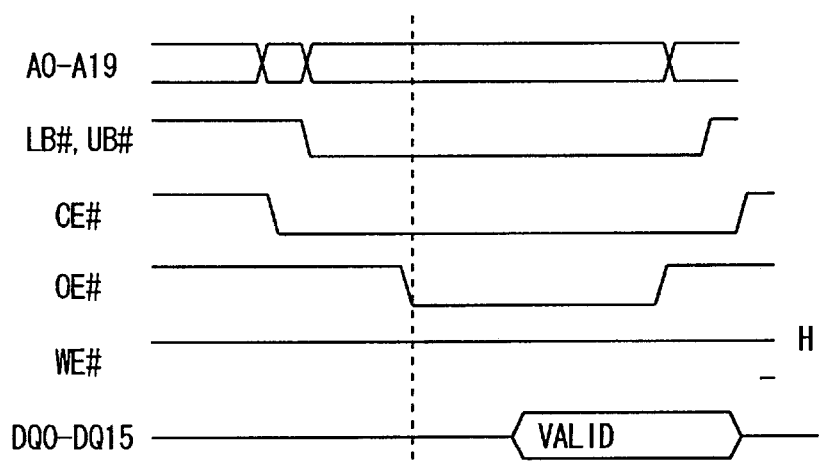
FIG. 2 is a timing chart representing data reading operation of the semiconductor memory device as shown in FIG. 1.

FIG. 2 is a signal waveform chart representing data reading operation of semiconductor memory device 1 shown 1. Referring to FIG. 2, chip enable signal CE# is set to the L level, and upper byte enable signal UB# and lower byte enable signal LB# for designating upper byte data and lower byte data respectively are set to the L level in accordance with data bits to be read. In this state, address signal bits A0 to A19 are set and subsequently, output enable signal OE# is set to the L level. Write enable signal WE# is maintained at the H level.

With the falling to the L level of output enable signal OE# being used as a trigger, under control of internal control signal generating circuit 12, row address buffer 3 and column address buffer 4 receive external address signal bits A0 to A19 and generate internal row address signal RA and internal column address signal CA, respectively. According to internal row address signal RA and internal column address signal CA, row decoder 5 and column decoder 6 perform decoding operation at predetermined timings under control of internal control signal generating circuit 12 to select memory cells, and data of the selected memory cells are read out externally.

When upper byte enable signal UB# is at the H level, upper byte data DQ8 to DQ15 are set in a high impedance state. When lower byte enable signal LB# is set to the L level, valid data appears on lower byte data DQ0 to DQ7. The external data maintains the valid state till the output circuit is set in a disable state, even when output enable signal OE# goes high and.

Figure 3:
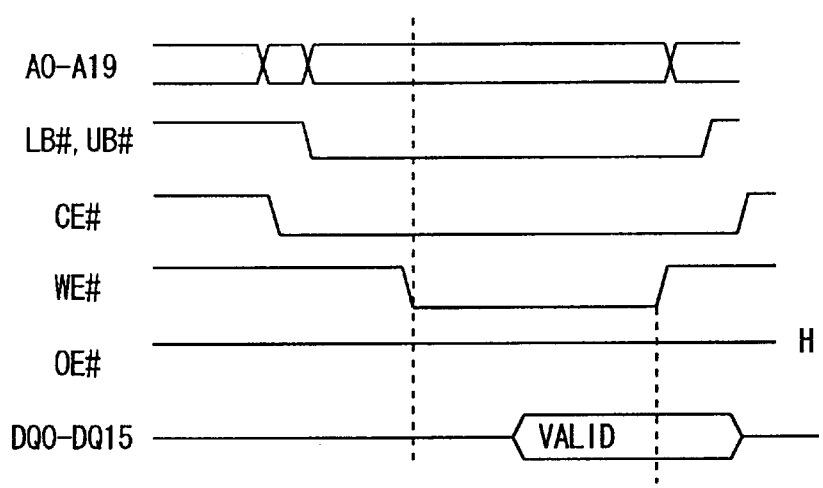
FIG. 3 is a timing chart representing data writing operation of the semiconductor memory device shown in FIG. 1.

FIG. 3 is a signal waveform chart representing data writing operation of semiconductor memory device 1 shown in FIG. 1. As shown in FIG. 3, also in the data writing operation, according to upper byte enable signal UB# and lower byte enable signal LB#, validity/invalidity of upper byte data and lower byte data is designated. When chip enable signal CE# is at L level, the semiconductor memory device 1 can be accessed. In the data writing operation, write enable signal WE# is lowered to the L level, and output enable signal OE# maintains at the H level. With the falling of write enable signal WE# used as a trigger, address signal bits A19 to A0 applied externally are taken internally, internal row address signal RA and internal column address signal CA are generated by row address buffer 3 and column address buffer 4, respectively. In accordance with the internal address signals RA and CA, a memory cell selecting operation is performed by row decoder 5 and column decoder 6 shown in FIG. 1. Data bits DQ0 to DQ15 applied externally are selectively written internally in accordance with upper byte enable signal UB# and lower byte enable signal LB#, and data are written to selected memory cells.

Semiconductor memory device 1 shown in FIG. 1 is a DRAM-based semiconductor memory device in which row selecting operation and column selecting operation are executed in a time division multiplexed manner. When a data access is designated by write enable signal WE# or output enable signal OE#, a row address signal and a column address signal are internally generated in accordance with an address signal applied externally. At the time of selecting a memory cell, the row selecting operation is performed first, and memory cell data on the selected row is latched by the sense amplifiers included in block 7. Subsequently, the column selecting operation is performed and data of the selected memory cells are read or data are written to the selected memory cells.

As shown in the signal waveform charts of FIGS. 2 and 3, semiconductor memory device 1 shown in FIG. 1 takes in external address signals applied externally and performs data reading/writing operation in accordance with chip enable signal CE#, output enable signal OE#, and write enable signal WE#. The control signals used in semiconductor memory device 1 are the same as those used in an SRAM. Therefore, the interface of semiconductor memory device 1 has compatibility with an SRAM.

When an access is executed through a access sequence different from a normal access sequence in accordance with external control signals CE#, OE#, and WE# and address signal bits A0 to A19, test mode control circuit 20 determines that the test mode is designated and enters a test mode. In the test mode, according to signals (command) applied externally, it is allowed to accept the signals (command) for setting a test to be performed in the test mode. Specifically, when a specific access sequence is executed, the test mode is set, and a state for accessing a test mode instruction signal (command) applied externally is set. In the test mode, a test content to be executed in the test mode is designated according to address signal bits applied externally. According to test mode designation signal TMD, state control circuit 22 sets the internal state.

Figure 4:
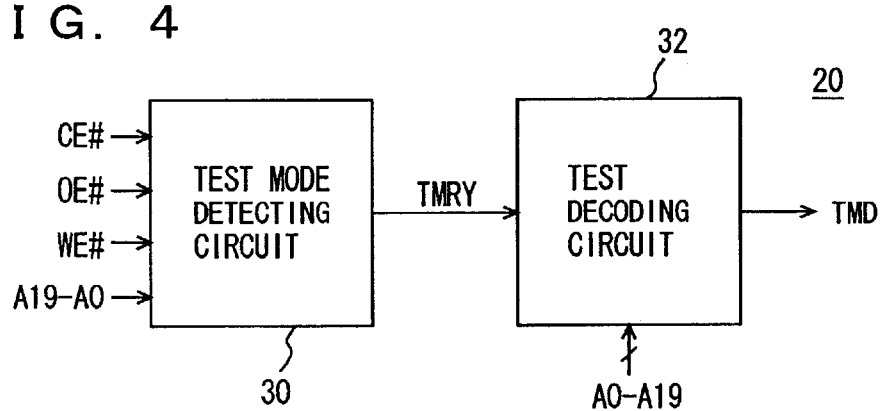
FIG. 4 is a diagram schematically showing the configuration of a test mode control circuit shown in FIG. 1.

FIG. 4 is a diagram schematically showing the configuration of test mode control circuit 20 shown in FIG. 1. In FIG. 4, test mode control circuit 20 includes: a test mode detecting circuit 30 receiving external control signals CE#, OE#, and WE# and external address signal bits A19 to A0 and generating, when these external signals are applied in a predetermined sequence, a test mode entry signal TMRY; and a test decoding circuit 32 activated, when test mode entry signal TMRY is made active, to generate test decode signal (test mode designating signal) TMD for specifying a test to be performed in accordance with address signal bits A0 to A19 applied externally.

As shown in FIG. 4, in test mode control circuit 20, first, a test mode entry for setting a test mode is detected by test mode detecting circuit 30 and after the test mode entry, a test mode for designating a test is set. By test decoding circuit 32, test decode signal (test mode designating signal, simply referred to as a test decode signal) TMD for designating the specified test content is generated.

Figure 5:
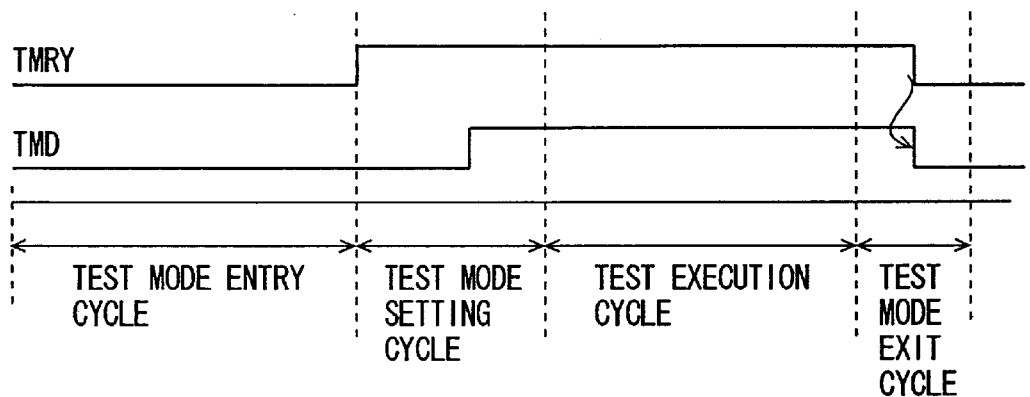
FIG. 5 is a timing chart representing operation of the test mode control circuit shown in FIG. 4.

FIG. 5 is a signal waveform chart representing the operation of test mode control circuit 20 shown in FIG. 4. As shown in FIG. 5, in order to perform a test, a test mode entry cycle for entering the test mode is executed. In the test mode entry cycle, the semiconductor memory device is accessed through an access sequence that is not normally used. The access sequence is detected by test mode detecting circuit 30 and test mode entry signal TMRY is activated. Subsequently, after the test mode entry, a test mode setting cycle for specifying a test is executed. A test content to be performed in the test mode is specified by test decoding circuit 32, and corresponding test decode signal TMD is activated. In the test mode setting cycle, a plurality of kinds of test contents may be simultaneously specified, or alternatively, the test mode setting cycle for specifying a test content to be performed in the test mode may be repeated.

After completion of the test mode setting cycle, a test execution cycle starts. State control circuit 22 sets the internal state in accordance with test decode signal TMD, and the designated test is carried out in the semiconductor memory device.

After completion of the designated test, a test mode exit cycle for completing the test mode is executed. Test mode entry signal TMRY and test decode signal TMD are made inactive.

As shown in FIG. 5, by providing the test mode entry cycle and the test mode setting cycle separately, even in the case where a CBR (CAS before RAS) condition cannot be used in the DRAM-based semiconductor memory device, the test mode is set and a test can be performed with the external signals similar to those of a normal SRAM.

In the above description, when an access is made successively in a sequence different from a normal access sequence, test mode detecting circuit 30 activates test mode entry signal TMRY. However, the test mode entry may be alternatively done by, for example, the following sequence. When chip enable signal CE# is at the H level, both write enable signal WE# and output enable signal OE# are set to the L level. Subsequently, chip enable signal CE# is set to the L level. It is also possible to make the test mode entry when a "WOBC (WE and OE before CE)" condition is satisfied.

In the test mode setting cycle, a test setting cycle for specifying a test content is performed once or a plurality of times. During execution of the test mode setting cycle, after the test mode entry cycle and after a so-called a "NOP" cycle, the test setting cycle may be carried out. In the "NOP" cycle, a test is not specified.

As described above, according to the first embodiment of the present invention, when an access is made in a sequence different from a sequence performed in a normal operation, the test mode entry is done, and the test setting cycle for specifying a test content to be performed in the test mode is executed. A test mode of the DRAM-based semiconductor memory device (SRAM alternative memory) can be set by the use of the signals used in the normal SRAM.

Second Embodiment

Figure 6:
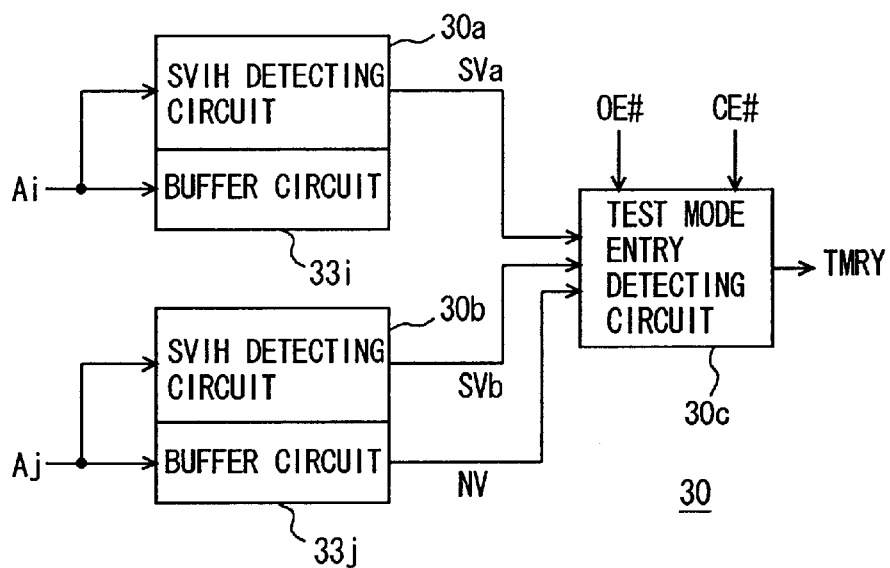
FIG. 6 is a diagram schematically showing the configuration of a test mode detecting circuit shown in FIG. 4.

FIG. 6 is a diagram schematically showing the configuration of test mode detecting circuit 30 included in test control circuit 20 according to a second embodiment of the invention. In FIG. 6, test mode detecting circuit 30 includes: an SVIH detecting circuit 30a for receiving an address signal bit Ai; an SVIH detecting circuit 30b for receiving an address signal bit Aj; and a test mode entry detecting circuit 30c for receiving output signals of SVIH detecting circuits 30a and 30b and an output signal of a buffer circuit 33j for receiving address signal bit Aj.

For address signal bit Ai, a buffer circuit 33i is also provided. Buffer circuits 33i and 33j are included in row address buffer 3 and column address buffer 4 shown in FIG. 1, and address signal bits Ai and Aj are address signals of any two bits out of address signal bits A19 to A0 shown in FIG. 1.

When the corresponding address signal bits Ai and Aj satisfy a "super VIH condition", SVIH detecting circuits 30a and 30b output H level signals, respectively. The "super VIH condition" is a condition that a corresponding signal is set to a voltage level higher than a level of a normal operation supply voltage. In the following description, the logic level of a signal satisfying the supper VIH condition is indicated by "HH" and the logic level of a signal at the normal supply voltage level is indicated by "H".

When output signals of SVIH detecting circuits 30a and 30b and buffer circuit 33a enter a predetermined state and the state continues for a plurality of cycles, test mode entry detecting circuit 30c drives test mode entry signal TMRY to an active state.

Figure 7:
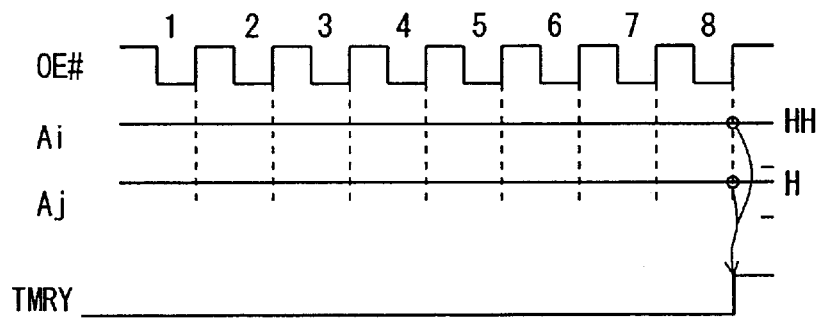
FIG. 7 is a timing chart representing operation of the test mode detecting circuit shown in FIG. 6.

FIG. 7 is a timing chart representing an example of the operation of test mode detecting circuit 30 shown in FIG. 6. Referring to FIG. 7, the operation of test mode detecting circuit 30 shown in FIG. 6 will be described in the following.

Chip enable signal CE# is set to the L level, address signal bit Ai is set to the HH level, and address signal bit Aj is set to the H level. In this state, output enable signal OE# is toggled a predetermined number of times (eight times in FIG. 7). In a cycle where output enable signal OE# is at the L level, an output signal SVa of SVIH detecting circuit 30a is at the H level and on the other hand, an output signal SVb of SVIH detecting circuit 30j is at the L level. An output signal NV of buffer circuit 33j is at the H level. When this combination of the above described states is given a predetermined number of times (for example, eight times) successively, test mode entry detecting circuit 30c drives the test mode entry signal TMRY to an active state.

The super VIH condition and the normal VIH condition can be discriminated from each other reliably, and erroneous determination of the super VIH condition due to noise or the like can be prevented. By recognizing this condition a predetermined number of times, the test mode can be accurately entered. In the normal operation mode, even in the case where the super VIH condition is erroneously satisfied by noise or the like, the possibility that such condition is satisfied the predetermined number of times successively is very low. Consequently, erroneous entry into test mode can be prevented reliably in the normal operation mode.

Figure 8:
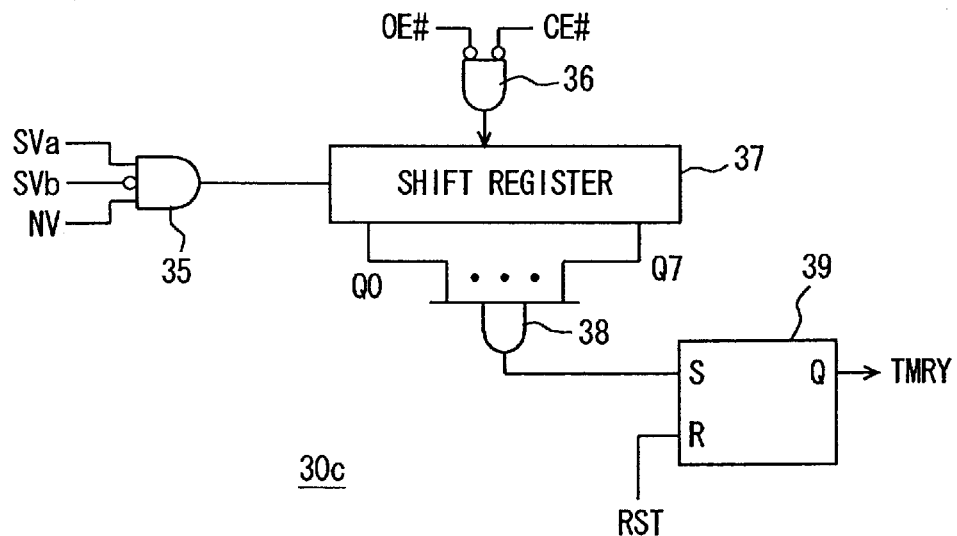
FIG. 8 is a diagram showing an example of the configuration of a test mode entry detecting circuit shown in FIG. 6.

FIG. 8 is a diagram showing an example of the configuration of test mode entry detecting circuit 30c shown in FIG. 6. In FIG. 8, test mode entry detecting circuit 30c includes: a gate circuit 35 for receiving output signals SVa and SVb of SVIH detecting circuits 30a and 30b shown in FIG. 6 and output signal NV of buffer circuit 33a; a gate circuit 36 for receiving output enable signal OE# and chip enable signal CE#; shift register 37 for shifting an output signal of gate circuit 35 in accordance with an output signal of gate circuit 36; a gate circuit 38 for receiving output signals Q0 to Q7 of shift register 37; and a set/reset flip flop 39 set in accordance with an output signal of gate circuit 38 and reset in response to a reset signal RST. From set/reset flip flop 39, test mode entry signal TMRY is generated.

Gate circuit 35 outputs a H level signal when both the signals SVa and NV are at the H level and signal SVb is at the L level. Gate circuit 36 outputs a H level signal when both output enable signal OE# and chip enable signal CE# are at the L level.

Shift register 37 performs shifting operation in accordance with an output signal of gate circuit 36. It is sufficient for shift register 37 to have a normal configuration and perform shifting operation in accordance with an output signal of gate circuit 36. Shift register 37 includes eight shifters and output signals Q0 to Q7 of eight bits are set according to the output signal of gate circuit 35.

Gate circuit 38 outputs an H level signal when all the output signals Q0 to Q7 of shift register 37 are at the H level to set set/reset flip flop 39.

When address signal bit Ai is at the HH level, output signal SVa from SVIH detecting circuit 30a goes high to H level. When address signal bit Aj is at the H level, output signal SVb of SVIH detecting circuit 30b is at L level. Therefore, when address signal bit Ai is at the HH level and address signal bit Aj is at the H level, gate circuit 35 outputs the H level signal. When such state is satisfied eight cycles successively, all the output signals Q0 to Q7 of shift register 37 attain the H level.

At the time of test mode entry, when the output signal of gate circuit 35 is set at L level even in one cycle, one of output signals Q0 to Q7 is at the L level in shift register 37, so that the test mode entry is reset. By setting address signal bits Ai and Aj to the HH level and the H level, respectively, a predetermined number of times (for example, eight times) in a row, all of output signals Q0 to Q7 of shift register 37 can be set to the H level and test mode entry signal TMRY can be set to the H level.

The reason why output enable signal OE# is used for test mode entry is to prevent that data stored in the internal memory cell is changed through data writing operation and an accurate test cannot be performed. When data stored in the memory cell is allowed to be destroyed upon test mode entry, write enable signal WE# may be used. Writing and reading operations may be executed in a predetermined sequence.

In place of the address signal bits, data bits may be used for determining the super VIH condition. Alternatively, a combination of an address signal bit and a data bit may be used for determining the super VIH condition.

As described above, according to the second embodiment of the invention, by using the signals of the super VIH condition (HH level) and the normal VIH condition (H level), the test mode entry is done. The super VIH state can be accurately discriminated without being influenced by noise or the like. When the super VIH and normal VIH conditions are satisfied a predetermined number of times successively, the test mode entry signal is driven to an active state, so that the test mode can be prevented from being erroneously set due to an influence of noise or the like in the normal operation mode.

By using the address signal bits and/or data bits, the high order address signal bits and the low order address signal bits can be replaced with each other, or the upper data bits and the lower data bits can be replaced with each other. Thus, replacability of the high order and low order signals used upon the test mode entry can be implemented. Thus, the configuration for the test mode entry can be readily changed according to the configuration of a semiconductor memory device to which the present invention is applied.

Third Embodiment

Figure 9:
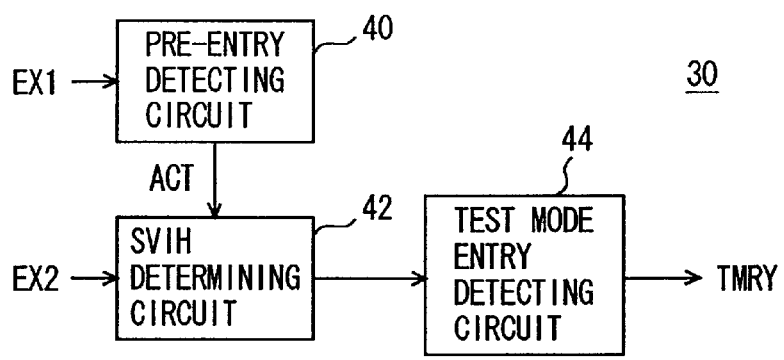
FIG. 9 is a diagram schematically showing the configuration of a test mode detecting circuit according to a second embodiment of the invention.

FIG. 9 is a diagram schematically showing the configuration of test mode detecting circuit 30 according to a third embodiment of the invention. In FIG. 9, test mode detecting circuit 30 includes: a pre-entry detecting circuit 40 for activating a output signal thereof when an external signal EX1 satisfies a predetermined condition; an SVIH determining circuit 42 activated in response to an activation of the output signal of pre-entry detecting circuit 40, for determining the super VIH condition of an external signal EX2; and a test mode entry detecting circuit 44 for activating test mode entry signal TMRY in accordance with the output signal of SVIH determining circuit 42.

SVIH determining circuit 42 corresponds to SVIH detecting circuits 30a and 30b shown in FIG. 6. Test mode entry detecting circuit 42 corresponds to test mode entry detecting circuit 30c shown in FIG. 8. SVIH determining circuit 42 may have the same configuration as that of SVIH detecting circuits 30a and 30b, and test mode entry detecting circuit 44 may have the same configuration as that of test mode entry detecting circuit 30c.

External signal EX1 is an address signal bit or a data bit. Pre-entry detecting circuit 40 activates SVIH determining circuit 42 when a specific address or a specific data pattern is applied in a predetermined sequence a predetermined number of times successively. Also upon pre-entry, output enable signal OE# is activated, and each setting cycle is determined by the toggle of output enable signal OE#.

When kept inactive, SVIH determining circuit 42 has the path of flowing operation current cut off, so that current consumption is reduced. When made active, SVIH determining circuit 42 determines whether external signal EX2 satisfies the super VIH condition or not.

In a manner similar to the second embodiment, when an output signal of SVIH determining circuit 42 is made active a predetermined number of times successively, test mode entry detecting circuit 44 drives test mode entry signal TMRY to an active state.

Figure 10:
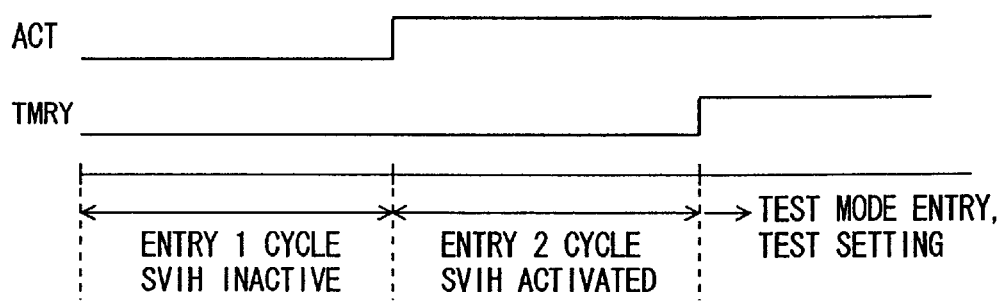
FIG. 10 is a timing chart representing operation of the test mode detecting circuit shown in FIG. 9.

In the third embodiment, therefore, as shown in FIG. 10, for the test mode entry, an entry cycle 1 for activating SVIH determining circuit 42 and an entry cycle 2 for determining whether or not the super VIH condition is satisfied a predetermined number of times successively and entering the test mode in accordance with the determination result are executed. By activating the SVIH detecting circuit in SVIH determining circuit 42 in the entry cycle 2, SVIH determining circuit 42 is operated only in a necessary period, thereby reducing current consumption.

Figure 11:
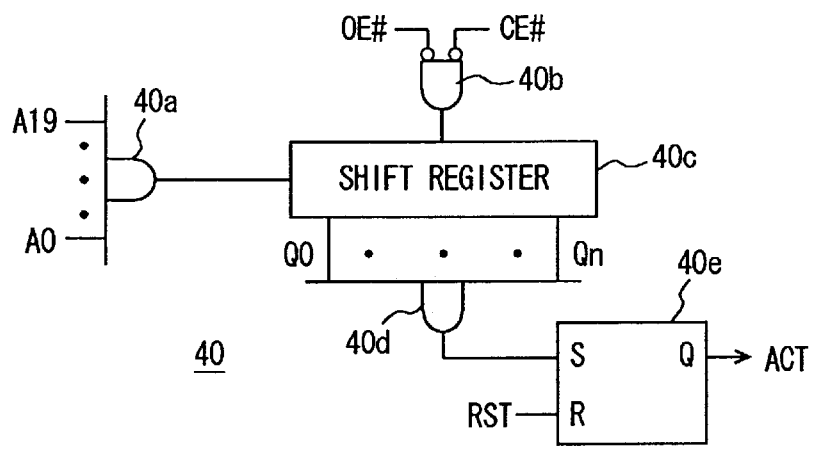
FIG. 11 is a diagram showing an example of the configuration of a pre-entry detecting circuit shown in FIG. 9.

FIG. 11 is a diagram showing an example of the configuration of pre-entry detecting circuit 40 shown in FIG. 9. In FIG. 11, pre-entry detecting circuit 40 includes: a gate circuit 40a for receiving address signal bits A19 to A0; a gate circuit 40b for receiving output enable signal OE# and chip enable signal CE#; a shift register 40c for performing shifting operation in accordance with an output signal of gate circuit 40b to sequentially shift an output signal of gate circuit 40a; a gate circuit 40d for outputting an H level signal when all of output signals Q0 to Qn of shift register 40c are at the H level; and a reset/reset flip flop 40e set in response to the rising of an output signal of gate circuit 40d to generate an activation signal ACT for activating SVIH determining circuit 42 from an output thereof Q. Set/reset flip flop 40e receives reset signal RST which is made active upon, for example, the system resetting or power on at a reset input thereof.

Gate circuit 40a outputs the H level signal when address signal bits A19 to A0 designate a specific address. As a bit pattern of the specific address of address signal bits A19 to A0, a bit pattern for designating the final address such as "11 . . . 1" may be used. Another address may be used.

Gate circuit 40b outputs the H level signal when both chip enable signal CE# and output enable signal OE# are at the H level, that is, in a data output operation mode to cause shift register 40c to perform the shifting operation. When a specific address is designated by address signal bits A0 to A19 and the data reading operation is performed a predetermined number of times ((n+1) times) successively, shift register 40c sets all of output signals Q0 to Qn to the H level.

Therefore, when data at a specific address is read (n+1) times successively, the output signal of gate circuit 40d goes high, set/reset flip flop 40e is set, and activation signal ACT is made active.

In the normal operation mode, the possibility that data in the specific address is read (n+1) times (for example, eight times) successively is low, so that SVIH determining circuit 42 can be prevented from being erroneously activated in the normal operation mode.

Figure 12:
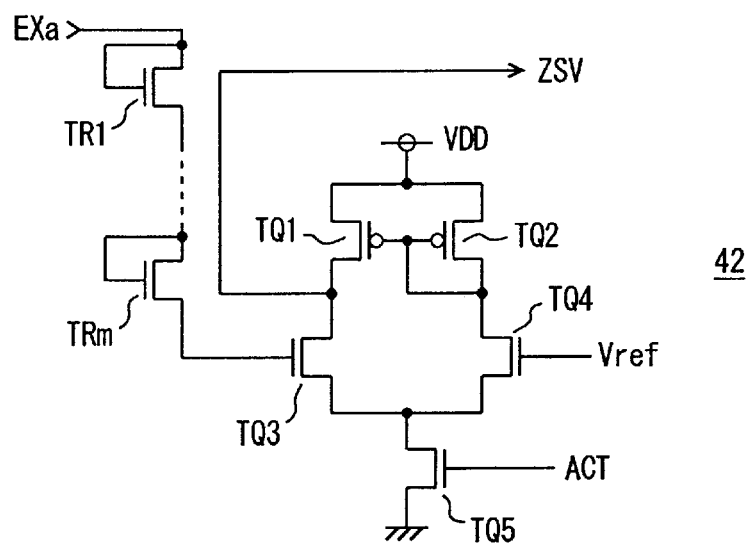
FIG. 12 is a diagram showing an example of the configuration of an SVIH determining circuit shown in FIG. 9.

FIG. 12 is a diagram showing an example of the configuration of the SVIH detecting circuit included in SVIH determining circuit 42 shown in FIG. 9. In FIG. 12, the SVIH detecting circuit included in SVIH determining circuit 42 includes: diode-connected N-channel MOS transistors TR1 to TRm connected in series, for lowering the voltage level of an external signal EXa; P-channel MOS transistors TQ1 and TQ2 connected to the power supply node and constructing a current mirror circuit; N-channel MOS transistors TQ3 and TQ4 connected in series to P-channel MOS transistors TQ1 and TQ2, respectively; and an N-channel MOS transistor TQ5 connected between a common source node of MOS transistors TQ3 and TQ4 and the ground node, for receiving an activation signal ACT at a gate thereof.

MOS transistor TQ3 receives, at a gate thereof, external signal EXa applied via diode-connected MOS transistors TR1 to TRm, and MOS transistor TQ4 receives reference voltage Vref at a gate thereof.

In the configuration of the SVIH detecting circuit shown in FIG. 12, by diode-connected MOS transistors TR1 to TRm, the voltage level of external signal EXa is dropped by m·Vth. Here, Vth represents a threshold voltage of each of MOS transistors TR1 to TRm.

MOS transistors TQ1 and TQ2 construct a current mirror circuit. When the sizes (gate width to gate length) of MOS transistors TQ1 and TQ2 are the same, a current of the same magnitude is supplied through these MOS transistors TQ1 and TQ2. In this case, a master stage of the current mirror circuit is constructed by MOS transistor TQ2, and a mirror current of a current flowing through MOS transistor TQ2 flows through MOS transistor TQ1. MOS transistors TQ3 and TQ4 construct a differential stage and compare reference voltage Vref with the voltage level of a signal applied via MOS transistor TRm.

MOS transistor TQ5 functions as a current source transistor in the SVIH detecting circuit and is made conductive when activation signal ACT is at the H level to make conductive a path through which an operation current flows in the SVIH detecting circuit. When activation signal ACT is at the L level, MOS transistor TQ5 is in a non-conductive state, so that the path of the current from the power supply node to the ground node in the SVIH detecting circuit is cut off, and an output signal ZSV of the SVIH detecting circuit is maintained at the H level.

When activation signal ACT goes high, MOS transistors TQ3 and TQ4 perform comparing operation. When external signal EXa is at the HH level and the super VIH condition is satisfied, the gate voltage of MOS transistor TQ3 becomes higher than reference voltage Vref, conductance of MOS transistor TQ3 becomes greater than that of MOS transistor TQ4, a current supplied via MOS transistor TQ1 is discharged, SVIH detection signal ZSV output from the connection node of MOS transistors TQ1 and TQ3 goes low, to indicate that external signal EXa satisfies the SVIH condition.

When the voltage level of external signal EXa is lower than the HH level and is the H level or L level, the gate voltage of MOS transistor TQ3 becomes lower than reference voltage Vref, and the conductance of MOS transistor TQ3 becomes smaller than that of MOS transistor TQ4. Accordingly, MOS transistor TQ3 cannot discharge the mirror current supplied via MOS transistor TQ1 of the current mirror circuit, and SVIH detection signal ZSV goes high. This is because the master stage of the current mirror circuit is constructed by MOS transistor TQ2, and a current of the same magnitude as that of a current flowing through MOS transistors TQ2 and TQ4 is supplied to MOS transistor TQ3 via MOS transistor TQ1 (when the sizes of MOS transistors TQ1 and TQ2 are equal to each other).

For entry 1 cycle in which activation signal ACT is set at the L level, the operation current in SVIH determining circuit 42 is cut off, and current consumption can be reduced.

In place of address signal bits A0 to A19, data bits DQ may be supplied to pre-entry detecting circuit 40. Alternately, a combination of a specific address bit out of address signal bits A0 to A19 and a specific bit out of data bits DQ0 to DQ15 may be used in combination.

The number of shifting times of shift register 40c is arbitrary as long as the test mode can be prevented from being erroneously set in the normal operation mode.

Modification

Figure 13:
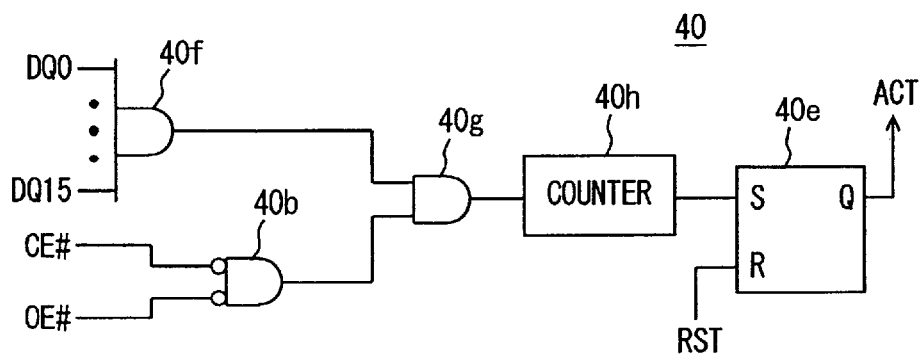
FIG. 13 is a diagram showing a modification of the pre-entry detecting circuit shown in FIG. 9.

FIG. 13 is a diagram schematically showing the configuration of pre-entry detecting circuit 40 as a modification of the third embodiment of the invention. In FIG. 13, pre-entry detecting circuit 40 includes: a gate circuit 40f for receiving data bits DQ0 to DQ15; a gate circuit 40b for receiving chip enable signal CE# and output enable signal OE#; a gate circuit 40g for receiving output signals of gate circuits 40f and 40b; a counter 40h for counting the H level of an output signal of gate circuit 40g; and a set/reset flip flop 40e set in response to a carry signal from counter 40h to generate activation signal ACT.

In the configuration shown in FIG. 13, in place of address signal bits A0 to A19, data bits DQ0 to DQ15 are used. For data bits, only upper byte data DQ8 to DQ15 or only lower byte data DQ0 to DQ8 may be used.

When data bits DQ0 to DQ15 are set in a specific pattern, gate circuit 40f outputs an H level signal. FIG. 13 shows, as an example, a case where gate circuit 40f outputs the H level signal when all data bits DQ0 to DQ15 are set to "1".

When both chip enable signal CE# and output enable signal OE# go low, gate circuit 40b outputs the H level signal. That is, when the data read mode is designated, the output signal of gate circuit 40b goes high.

When both output signals of gate circuits 40f and 40b are at the H level, gate circuit 40g outputs the H level signal. Therefore, when a specific data bit pattern is applied and the data read mode is designated, gate circuit 40g outputs the H-level signal. Counter 40h counts the number of H level signals from gate circuit 40g. According to the carry signal of counter 40h, set/reset flip flop 40e is set and activation signal ACT is made active.

In the case where counter 40h is used and activation signal ACT is made active when the read operation is designated, for example, eight times successively, counter 40h can be constructed by three cascaded flip flops. Therefore, the circuit scale can be reduced as compared with the case of using a normal shift register.

When a different data bit pattern is applied in data reading mode, counter 40h may be reset. Alternately, when the data writing mode is designated by the same pattern, counter 40h may be reset. For the configuration for resetting counter 40h, a configuration of resetting counter 40h when an output signal of gate circuit 40f is at the L level and an output signal of gate circuit 40b is at the H level, or when an output signal of gate circuit 40f is at the H level and an output signal of gate circuit 40b is at the L level may be employed.

Also in shift register 40c shown in FIG. 11, when the data writing mode is designated, a corresponding bit in shift register 40c may be set to the L level. Specifically, by supplying an output signal of gate circuit 40g to shift register 40c by using gate circuits 40f, 40b, and 40g shown in FIG. 13 in place of gate circuit 40a shown in FIG. 11, a configuration of resetting a corresponding bit in shift register 40c can be easily implemented.

Reset signal RST is activated when the system is reset or the power is on.

As described above, according to the third embodiment of the invention, when external signals meet a specific condition, the super VIH condition is determined and the test mode entry is determined. The operation of the SVIH detecting circuit (determining circuit) of high current consumption is limited in the minimum necessary period. In the normal operation mode, the operation of the SVIH detecting circuit (determining circuit) is stopped, so that the current consumption in the normal operation mode can be reduced.

Fourth Embodiment

Figure 14:
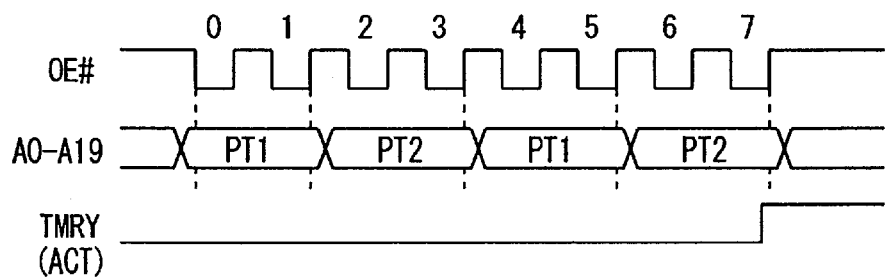
FIG. 14 is a timing chart representing an operation of a semiconductor memory device according to a fourth embodiment of the invention.

FIG. 14 is a timing chart representing the operation upon the test mode entry of a semiconductor memory device according to a fourth embodiment of the invention. In FIG. 14, as address signal bits A19 to A0, two address patterns PT1 and PT2 are alternately supplied every two cycles. Address pattern PT1 is, for example, "00111110011111111111" and address pattern PT2 is, for example, "11100001111111111110". Address patterns PT1 and PT2 are each an address of the least probability of accessing or are the address patterns having no regularity in between and are not accessed successively in the normal operation mode. By reading the two kinds of address patterns PT1 and PT2 eight times successively, test mode entry signal TMRY or activation signal ACT is made active. Thus, a test mode can be prevented from being erroneously set in the normal operation mode.

Figure 15:
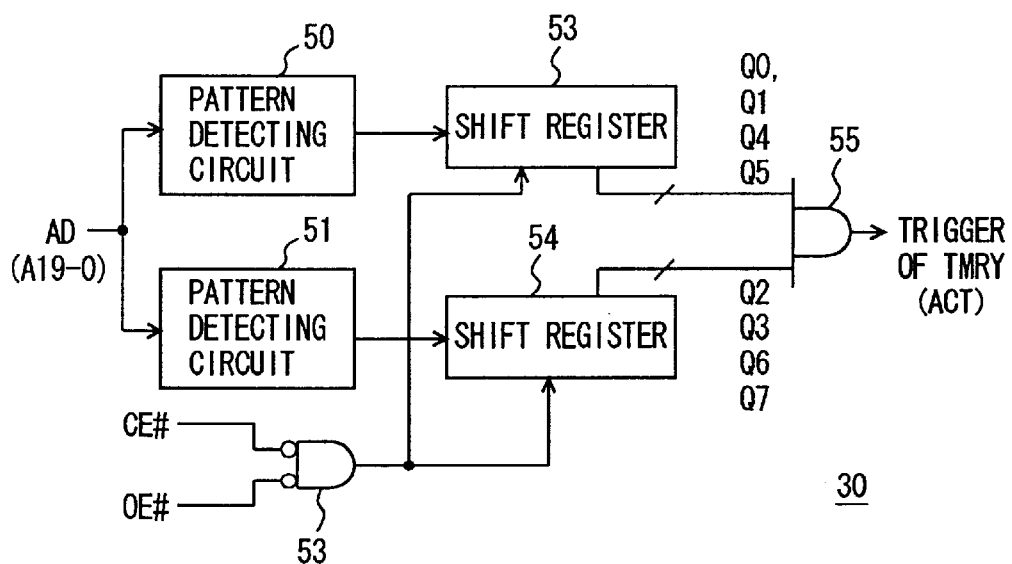
FIG. 15 is a diagram schematically showing the configuration of a test mode detecting circuit in the fourth embodiment of the invention.

FIG. 15 is a diagram schematically showing the configuration of test mode detecting circuit 30 according to a fourth embodiment of the present invention. In FIG. 15, test mode detecting circuit 30 includes: pattern detecting circuits 50 and 51 for receiving an address signal AD (bits A19 to A0) and each detecting whether address signal AD is set in a predetermined pattern or not; a gate circuit 52 for receiving chip enable signal CE# and output enable signal OE#; shift registers 53 and 54 for shifting output signals of pattern detecting circuits 50 and 51, respectively, in accordance with an output signal of gate circuit 52; and a gate circuit 55 for receiving predetermined output signals of shift registers 53 and 54 and when all the received signals are at the H level, generating a trigger signal for test mode entry signal TMRY or activation signal ACT.

Pattern detecting circuits 50 and 51 detect whether the address signal AD is set in the pattern PT1 and PT2 or not, respectively. As the configuration of each of pattern detecting circuits 50 and 51, a configuration similar to that of gate circuit 40a shown in FIG. 11 may be used. Alternately, such a configuration that an output signal of gate circuit 52 is applied to pattern detecting circuits 50 and 51, and only when the data read mode is designated, the result of pattern detection is made valid may be used.

Each of shift registers 53 and 54 performs shifting operation in accordance with the output signal of gate circuit 52. Gate circuit 52 outputs an H level signal when the data read mode is designated, and therefore, both shift registers 53 and 54 performs the shifting operation when the data read mode is designated. Consequently, as shown in FIG. 14, when patterns PT1 and PT2 are alternately supplied every two cycles, only predetermined output signals of shift registers 53 and 54 go high. Specifically, in FIG. 15, output signals Q0, Q1, Q4, and Q5 of shift register 53 go high, and output signals Q2, Q3, Q6, and Q7 of shift register 54 go high. The numbers of output signals of shift registers 53 and 54 shown in FIG. 15 correspond to the number of data read cycles shown in FIG. 14.

When all the predetermined output signals of shift registers 53 and 54 go high, gate circuit 55 triggers activation of test mode entry signal TMRY or activation signal ACT, to set the corresponding set/reset flip flop. When the predetermined address signal bit patterns are applied a predetermined number of times in the predetermined sequence, test mode entry signal TMRY or activation signal ACT is activated.

Therefore, while reliably preventing the test mode from being set in the normal operation mode, the test mode entry can be readily done without increasing the number of pin terminals.

In the fourth embodiment, for the specific address signal bit patterns, the final address "FFFFH" and the head address "0000H" may be used. It is sufficient to use an address or an access sequence of low access possibility in the normal operation mode. The address signal bits and data bits may be combined into a specific pattern. The reading and writing operations may be performed in a predetermined sequence in setting the test mode entry.

As described above, according to the fourth embodiment of the invention, when a plurality of kinds of predetermined patterns of the external signals are applied in a predetermined sequence a predetermined number of times successively, the test mode entry is done. Consequently, the test mode can be set reliably without exerting an adverse influence on the normal operation mode and without increasing the number of pins.

Fifth Embodiment

Figure 16:
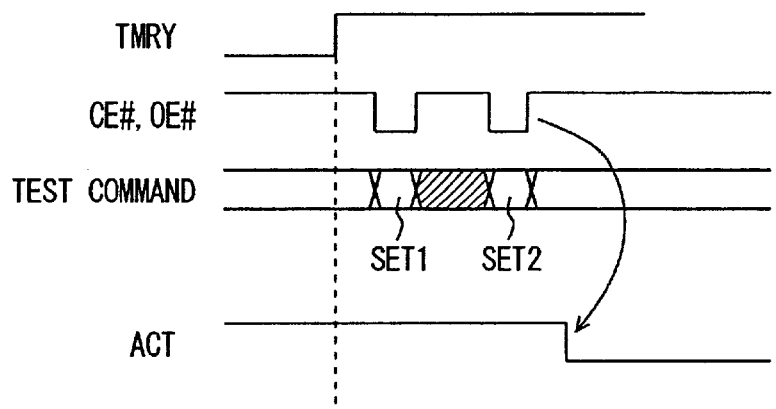
FIG. 16 is a timing chart representing an operation of a semiconductor memory device according to a fifth embodiment of the invention.

FIG. 16 is a timing chart representing the operation of a test content setting cycle of a semiconductor memory device according to a fifth embodiment of the invention. In the test content setting cycle, a test to be performed is designated. As shown in FIG. 16, when test mode entry signal TMRY is made active, the test content setting cycle is started, and a test to be performed is designated. In setting the test mode, the test content setting cycle of specifying a test to be performed is executed twice successively. When the test content setting cycle is executed twice, activation signal ACT is driven to the L level, and SVIH determining circuit (detecting circuit) is made inactive. In order to designate a test content to be performed again, the test mode entry has to be done again. The timing chart of FIG. 16 is based on the test mode entry operation according to the third embodiment shown in FIG. 10 in which the entry 1 and 2 cycles are executed for the test mode entry. When the designated test is performed, the operation of the SVIH detecting circuit is stopped, thereby preventing unnecessary current from being consumed and preventing the current consumption of the SVIH detecting circuit (determining circuit) from exerting an influence on the testing operation. The reason why the SVIH detecting circuit (determining circuit) is activated in the test setting cycle is that there is the possibility that a test command for designating a test content includes the SVIH condition. Each of test commands SET1 and SET2 can designate a plurality of test contents at the same time.

Figure 17:
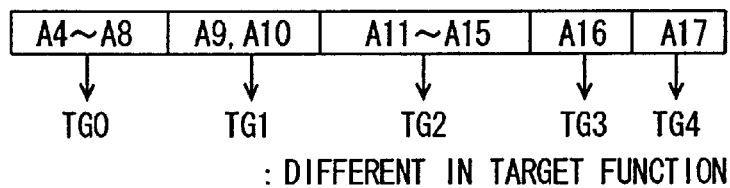
FIG. 17 is a diagram schematically showing the structure of a test mode setting command in the fifth embodiment of the invention.

FIG. 17 is a diagram showing an example of the structure of the test command. To specify a test content, address signal bits A17 to A4, for example, are used. Address signal bits A4 to A8 are used to specify a test content in a test group TG0, and one of the tests in a test group TG1 is specified by address signal bits A9 and A10. One of tests in a test group TG2 is specified by address signal bits A11 to A15. A test content in a test group TG3 is specified by address signal bit A16, and a test content in a test group TG4 is specified by address signal bit A17.

Test contents are grouped into test groups TG0 to TG4 in accordance with the functions to be tested. For example, a multi-bit test (MBT) for simultaneously writing/reading data in memory cells of a plurality of bits and an IO compression test of simultaneously writing/reading data to/from internal data lines (IO) are included in the same test group for a test function of determining whether data is accurately written/read or not. For example, tests regarding setting of internal voltages such as a bit line voltage, a sense amplifier power supply voltage, and the like are grouped in one group. Tests for performing various accelerated tests are grouped in a common test group. In the case where address signal bits A4 to A17 are used as a test command SET, two test cycles are successively performed, so that five kinds of test contents can be designated at the maximum in one test cycle. When one test group is designated in the first test cycle, setting of a test of the same test group is inhibited in the next cycle.

As shown in FIG. 17, address signal bits are used as a test command for specifying a test content and the functions of tests to be performed are classified by the address signal bits. Therefore, even when the number of test cycles is small, a number of test contents can be simultaneously set, and a complicated test can be performed with a short test mode setting time. Thus, the time required for a test can be shortened.

Figure 18:
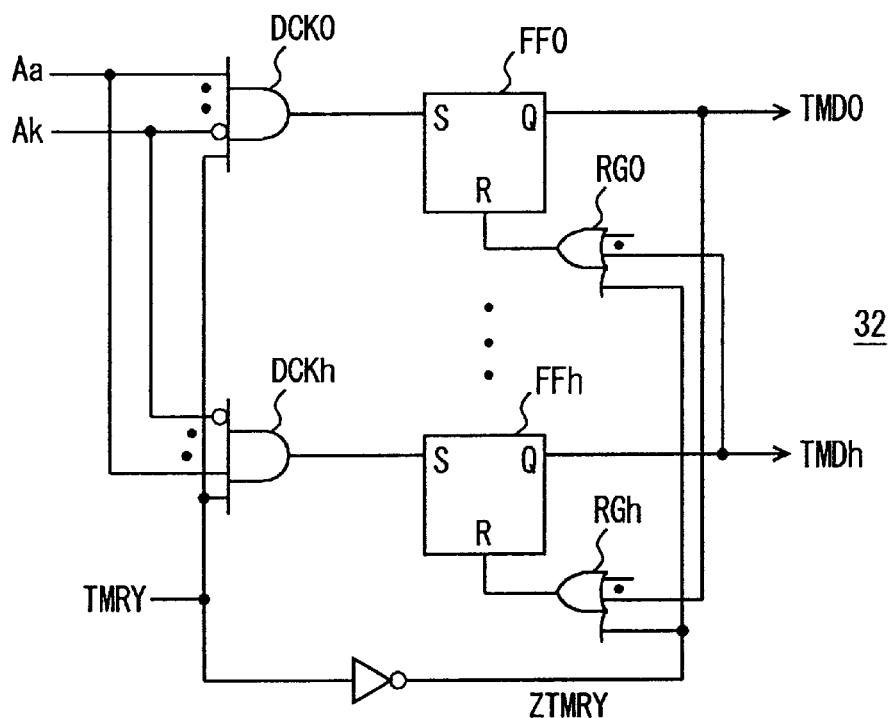
FIG. 18 is a diagram schematically showing the configuration of a test decoding circuit in the fifth embodiment of the invention.

FIG. 18 is a diagram showing an example of the configuration of test decoding circuit 32 shown in FIG. 4. In FIG. 18, test decoding circuit 32 includes: decoding circuits DCK0 to DCKh each arranged corresponding to a test group and receiving a set of address signal bits Aa to Ak allocated to a corresponding test group; set/reset flip flops FF0 to FFh provided corresponding to decoding circuits DCK0 to DCKh, respectively, and each set when an output signal of a corresponding decoding circuit is at the H level to activate a corresponding one of test decode signals TMD0 to TMDh; and reset gate circuits RG0 to RGh provided in correspondence with flip flops FF0 to FFh, respectively, for receiving output signals of the flip flops except the corresponding flip flop and a complementary test mode entry signal ZTMRY, and holding the output signals of the corresponding flip flops in an inactive state.

To decoding circuits DCK0 to DCKh, test mode entry signal TMRY is applied. When test mode entry signal TMRY attains an active state (H level), decoding circuits DCK0 to DCKh are activated to perform a decoding operation. Each of decoding circuits DCK0 to DCKh is an AND type decoding circuit, and outputs an H level signal when a corresponding set of address signal bits Aa to Ak is in a predetermined combination allocated thereto.

When complementary test mode entry signal ZTMRY applied via the inverter receiving test mode entry signal TMRY is at the H level, gate circuits RG0 to RGh control outputs of flip flops FF0 to FFh so as to hold corresponding test decode signals TMD0 to TMDh, respectively, in an inactive state. When test mode entry signal TMRY is activated and complementary test mode entry signal ZTMRY responsively goes low, if a test in a test group is designated, gate circuits RG0 to RGh control outputs of corresponding flip flops FF0 to FFh such that another test in the same test group cannot be designated in the following test setting cycle.

Outputs of flip flops FF0 to FFh may be reset by gate circuits RG0 to RGh with any of the following configurations. An output signal of a gate circuit is applied to a reset input R of a corresponding flip flop to reset the output signal of the corresponding flip flop. Alternatively, test decode signals TMD0 to TMDh of the decoding circuits DCK0 to DCKh may be held in the inactive state by the output signals of respective gate circuits RG0 to RGh. Further, the flip flops FF0–FFh each may be configured to render an input signal received at an input thereof from a corresponding decoding circuit inactive in response to the output signal of a corresponding gate circuit. Any of the configurations may be used. When one test content is designated in one test group, another test content of the common test group is not designated.

Figure 19:
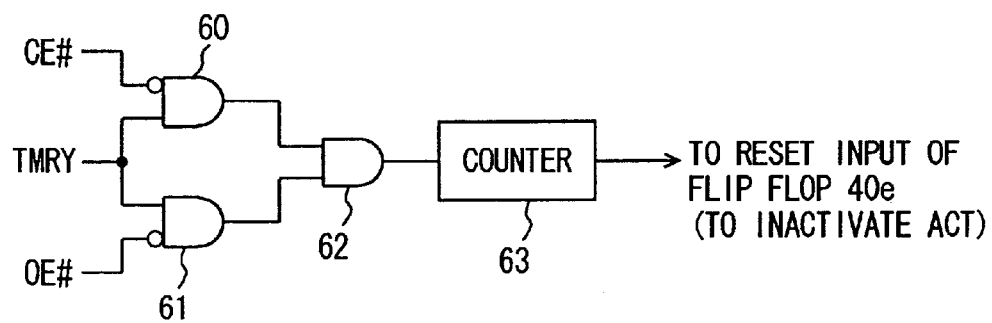
FIG. 19 is a diagram showing an example of the configuration of an SVIH resetting unit in the fifth embodiment of the invention.

FIG. 19 is a diagram showing the configuration of a portion for resetting the SVIH detecting circuit after completion of the test setting cycle. The configuration shown in FIG. 19 may be provided in, for example, pre-entry detecting circuit 40 shown in FIG. 9, to reset flip flop 40e, or may be provided separately on the outside of pre-entry detecting circuit 40, or may be provided in test mode entry detecting circuit 44.

In FIG. 19, the resetting portion of the SVIH detecting circuit includes: a gate circuit 60 receiving test mode entry signal TMRY and chip enable signal CE#; a gate circuit 61 receiving test mode entry signal TMRY and output enable signal OE#; a gate circuit 62 receiving output signals of gate circuits 60 and 61; and a counter 63 for counting an H level output signal of gate circuit 62 and applying a count-up signal to the reset input of flip flop 40e shown in FIG. 11.

Gate circuit 60 outputs an H level signal when test mode entry signal TMRY is at the H level and chip enable signal CE# is at the L level. Gate circuit 61 outputs an H level signal when test mode entry signal TMRY is at the H level and output enable signal OE# is at the L level. Consequently, gate circuit 62 outputs an H level signal when test mode entry signal TMRY is at the H level and the data read mode is designated. Write enable signal WE# may be further applied to each of gate circuits 60 and 61.

When counter 63 counts the output signal of gate circuit 62, for example, twice, counter 63 generates the count-up signal to make inactive activation signal ACT to be applied to the SVIH detecting circuit. Consequently, when the test setting cycle is completed, the SVIH detecting circuit is made inactive by counter 63.

In the configuration shown in FIG. 19, it is assumed that the test setting cycle is executed by designating the data read mode. In the case where the test command is identified using another operation mode, a timing signal for identifying the test command is used in place of chip enable signal CE# and output enable signal OE#.

When the test setting cycle is repeated a predetermined number of times (twice), the SVIH detection is not carried out. However, test mode entry signal TMRY maintains the active state at the H level, so that a test mode can be successively set. When test mode entry signal TMRY is at the H level, a test of the semiconductor memory device is performed. It is therefore possible to select a memory cell and access data under the state where the test mode is set by the test decode signal.

As a test entry cycle, the test mode entry scheme of the second or fourth embodiment may be also used.

After completion of the test setting cycle for specifying a test content to be performed in the test mode, test mode entry signal TMRY may be driven to the inactive state again. In this case, complementary test entry signal ZTMRY is not applied to resetting gate circuits RG0 to RGh shown in FIG. 18. For setting a test content, or for setting a test mode, the test mode entry is done. The designated test mode is reset by supplying a specific command to complete the test mode. In this case, the test mode is an operation mode of performing a test content designated in the test setting cycle.

As described above, according to the fifth embodiment of the invention, the test setting cycle is executed a plurality of number of times (twice) after the test mode entry. Test contents can be efficiently set and performed in short time, resulting in a shortened test time.

After completion of the test setting cycle, the SVIH detecting circuit (determining circuit) is made inactive, so that the current consumption can be reduced in the normal operation mode. In addition, in the test mode, a test can be accurately carried out without being influenced by the current consumption of the SVIH detecting circuit.

Sixth Embodiment

Figure 20:
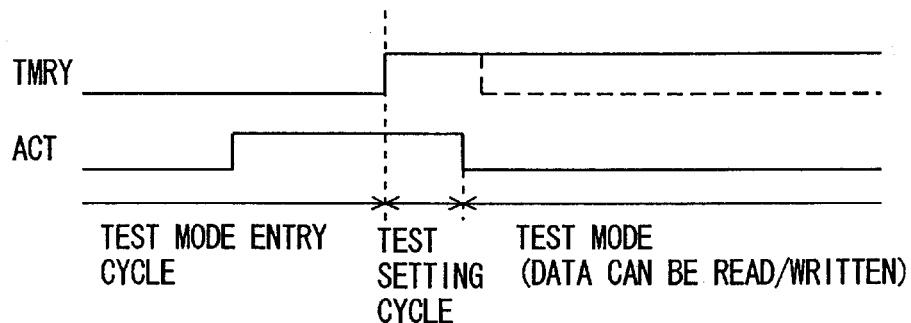
FIG. 20 is a signal waveform chart representing a test mode operation according to a sixth embodiment of the invention.

FIG. 20 is a diagram schematically showing a test sequence of a semiconductor memory device according to a sixth embodiment of the invention. In FIG. 20, the test mode entry cycle is executed as described in any of the first to fourth embodiments. In FIG. 20, an operation sequence in the case where the test entry 1 and 2 cycles are executed is shown as a representative example. In the test entry 2 cycle, activation signal ACT is made active and the super VIH condition is determined.

When the test mode entry cycle under the super VIH condition is completed, the test mode is set, and test mode entry signal TMRY attains an active state of the H level. According to test mode entry signal TMRY, the test decoding circuit is activated, the test setting cycle for specifying a test content is executed a predetermined number of times (twice in the fifth embodiment), and a test content to be performed is specified. Subsequently, after completion of the test cycle, the test mode is performed. In this case, test mode entry signal TMRY is maintained at the H level. Thus, the test mode operation is performed after completion of the test mode setting cycle and data can be accessed under the test condition. That is, for example, under an accelerated voltage condition, data can be written/read. It is therefore unnecessary to release the test condition and then perform the data writing/reading operation, and it is unnecessary to switch the operation mode. Moreover, the test mode entry cycle does not have to be performed again to add a test content, so that a test content can be easily added. It is also unnecessary to execute the test mode entry cycle each time a test mode is designated, so that the test time can be shortened.

Test mode entry signal TMRY may be set to the L level after completion of the test setting cycle (however, in the configuration shown in FIG. 18, flip flops FF0 to FFh are not reset).

As for the configuration of accessing data in the test mode, a circuit for receiving test decode signals TMD0 to TMDh is constructed so as not to inhibit the operation of the portion related to input/output of data, for permitting input/output of data even in the test mode. For example, in the case where multi selection of a plurality of word lines is carried out in an acceleration test, a test decode signal is applied to a row selecting circuit and the word lines are simultaneously selected. In this case, a column selecting operation and a data writing/reading operation are not merely inhibited.

Consequently, in the circuit configuration shown in FIG. 1, under the state where state control circuit 22 sets the internal state in accordance with test decode signal TMD, data can be accessed. With the configuration that data can be written and read when the test mode entry is done by setting test mode entry signal TMRY to the H level, the test entry 2 cycle is performed again to enter the test mode for adding a further test content, without the need of performing the test entry 1 cycle for adding the further test content. Thus, the number of operation cycles for the test mode entry can be reduced, and the number of cycles required to switch the operation mode can be reduced. In the case where the entry cycle is provided by a single kind as in the second and fourth embodiments, the test mode setting cycle is not required to perform.

As described above, according to the sixth embodiment of the present invention, normal data writing/reading operation can be performed while a test is performed. Thus, a new test content can be added in the test mode with a smaller number of mode entry cycles, so that the mode switching time can be shortened and accordingly, test time can be shortened. Moreover, data of a memory cell can be read under the test condition. Consequently, such the procedure is not required to read the test result that the test mode is completed, to set a normal operation mode for accessing memory cells. Thus, the mode switching time can be eliminated and the test time can be shortened.

Seventh Embodiment

Figure 21:
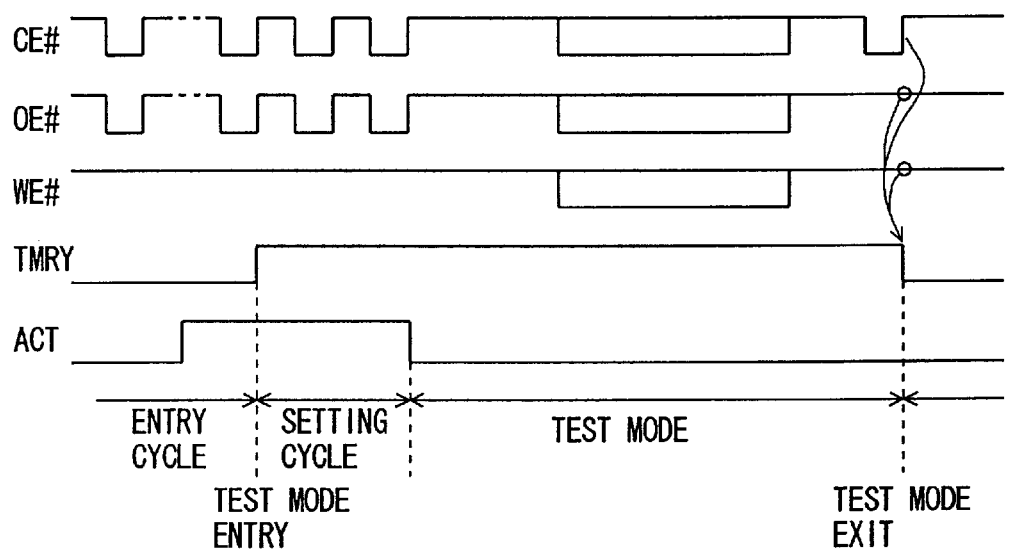
FIG. 21 is a timing chart representing an operation of a semiconductor memory device according to a seventh embodiment of the invention.

FIG. 21 is a diagram showing a test sequence of a semiconductor memory device according to a seventh embodiment of the present invention. In FIG. 21, by setting address signals or data bits in a predetermined pattern and designating a reading mode a predetermined number of times (eight times) successively, a test mode entry cycle is executed. In FIG. 21, in a manner similar to the previous third embodiment, for the test mode entry, the entry 1 and 2 cycles are executed. After completion of the entry 1 cycle, the super VIH condition can be determined. Activation signal ACT is activated, and the super VIH condition determination can be made. Under the super VIH condition, the data reading operation is executed a predetermined number of times by setting specific address signal bits or data bits in a predetermined pattern. According to the result of determination of the super VIH condition, test mode entry signal TMRY is activated, the test mode is entered, and a test content is set.

After completion of the test setting cycle for setting a test content, activation signal ACT is made inactive, and the SVIH determining circuit (detecting circuit) is made inactive. Subsequently, the test mode operation is performed according to the test content set in the test setting cycle. After completion of the test mode, both output enable signal OE# and write enable signal WE# are maintained at the H level and chip enable signal CE# is toggled (driven to the L level for a predetermined period). By the toggling of chip enable signal CE#, the test mode is completed, and test mode entry signal TMRY is made inactive.

By releasing the test mode by toggling chip enable signal CE#, even in the case where the test mode entry is erroneously made, the test mode can be easily exited. Since both write enable signal WE# and output enable signal OE# are maintained in the inactive state of the H level, the test mode can be completed without exerting any adverse influence on the data stored in a memory cell.

Figure 22:
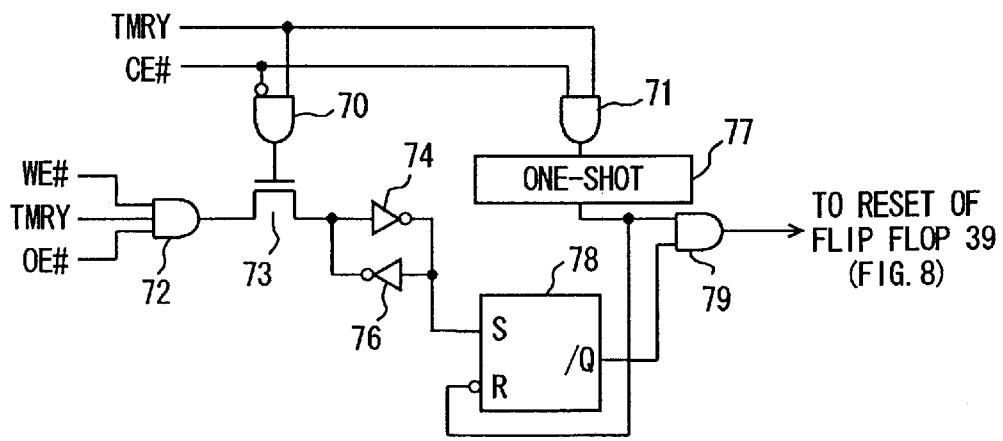
FIG. 22 is a diagram showing an example of the configuration of a test resetting portion in the seventh embodiment of the invention.

FIG. 22 is a diagram showing an example of the configuration of a test mode completing portion included in test mode controlling circuit 20. In FIG. 22, the test mode completing portion includes: a gate circuit 70 receiving test mode entry signal TMRY and chip enable signal CE#; an AND circuit 71 receiving test mode entry signal TMRY and chip enable signal CE#; an AND circuit 72 receiving write enable signal WE#, output enable signal OE#, and test mode entry signal TMRY; and a transfer gate 73 made conductive when an output signal of gate circuit 70 is at the H level, for transferring an output signal of AND circuit 72.

Gate circuit 70 outputs an H level signal when chip enable signal CE# is at the L level and test mode entry signal TMRY is at the H level. Transfer gage 73 is constructed of an N-channel MOS transistor (insulated gate type field effect transistor) or a CMOS (complementary MOS) transistor.

The test mode completing portion further includes: an inverter 74 for inverting a signal transmitted via transfer gate 73; an inverter 76 for inverting an output signal of inverter 74 and transmitting the inverted signal to the input of inverter 74; a one-shot pulse generating circuit 77 for generating a one-shot pulse signal in response to the rising of an output signal of AND circuit 71; a set/reset flip flop 78 set in response to the rising of an output signal of inverter 74 and reset in response to the falling of an output signal of one-shot pulse generating circuit 77; and an AND circuit 79 receiving a pulse signal from one-shot pulse generating circuit 77 and a signal of the output /Q of set/reset flip flop 78.

An output signal of AND circuit 79 is applied to a reset input of flip flop 39 shown in FIG. 8. When the output signal of AND circuit 79 is activated, test mode entry signal TMRY is made inactive.

Set/reset flip flop 78 outputs an L level signal from its output /Q in a set state.

In the test mode completing portion shown in FIG. 22, when test mode entry signal TMRY is at the L level, the output signal of gate circuit 70 is at the L level, and transfer gate 73 maintains the non-conductive state. In the initial state, set/reset flip flop 78 is in a reset state by a not-shown resetting unit and outputs the H level signal from the output /Q thereof. However, the output signal of AND circuit 78 is at the L level, no pulse signal is output from one-shot pulse generating circuit 77, and the output signal of AND circuit 79 is at the L level. In this state, test mode entry signal TMRY is set to the H level in accordance with the test mode entry cycle.

In a state where test mode entry signal TMRY is at the H level, when chip enable signal CE# goes low, an output signal of gate circuit 70 goes high. When chip enable signal CE# attains the H level, the output signal of AND circuit 71 attains the H level.

When both output enable signal OE# and write enable signal WE# are held at the H level in the state where chip enable signal CE# is at the L level, since test mode entry signal TMRY is at the H level in the test mode, the output signal of AND circuit 72 maintains the H level, and the H level signal is transmitted to inverter 74 via transfer gate 73. Since the output signal of inverter 74 is at the L level, set/reset flip flop 78 maintains the reset state and outputs the H level signal from its output /Q.

When chip enable signal CE# attains the H level in a state where both output enable signal OE# and write enable signal WE# are maintained at the H level, the output signal of AND circuit 71 attains the H level, and a one-shot pulse signal is generated from the one-shot pulse generating circuit in response to the rising of the output signal of AND circuit 71. Since the output signal of set/reset flip flop 78 is at the H level, the output signal of AND circuit 79 goes high in accordance with the one-shot pulse signal, flip flop 39 shown in FIG. 8 is reset, and test mode entry signal TMRY is driven to the L level.

On the other hand, when write enable signal WE# or output enable signal OE# is driven to the L level in a state where chip enable signal CE# is at the L level, an L level signal from AND circuit 72 is applied to inverter 74 via transfer gate 73. Consequently, in response to the rising of the output signal of inverter 74, set/reset flip flop 78 is set, a signal from the output /Q attains the L level, and an output signal of AND circuit 79 attains the L level.

In this state, even if both write enable signal WE# and output enable signal OE# are set at the H level before transfer gate 73 is made nonconductive, set/reset flip flop 78 is in the set state. Even when a one-shot pulse signal is generated in response to the rising of the output signal of AND circuit 71, an output signal of AND circuit 79 is at the L level, flip flop 39 shown in FIG. 8 is not reset, and test mode entry signal TMRY maintains at the H level.

When the one-shot pulse signal from one-shot pulse signal generating circuit 77 falls, set/reset flip flop 78 is reset, and the signal from output /Q of set/reset flip flop 78 attains the H level again. Since the pulse signal from one-shot pulse generating circuit 77 has already been fallen to the L level, the output signal of AND circuit 79 maintains the L level. When the test mode operation is executed and chip enable signal CE#, write enable signal WE#, and output enable signal OE# are toggled, set/reset flip flop 78 is set. Thus, in this test mode operation, the output signal of AND circuit 79 maintains the L level, and test mode entry signal TMRY maintains the H level, and the semiconductor memory device operates in the set test mode.

When test mode entry signal TMRY is at the H level, under the state where both output enable signal OE# and write enable signal WE# are held at the H level, chip enable signal CE# is lowered from the H level to the L level, and is driven (toggled) from the L level to the H level again. Thus, test mode entry signal TMRY can be set to the L level to complete the test mode.

In the test mode, if data is accessed, when chip enable signal CE# is set to the L level, write enable signal WE# or output enable signal OE# is driven to the L level for the data access. At the falling of chip enable signal CE#, set/reset flip flop 78 is always held in the set state, and AND circuit 79 is always fixed in a disable state. Therefore, resetting of flip flop 39 shown in FIG. 8 is not carried out, and test mode entry signal TMRY maintains the H level.

In the test setting cycle and the test mode, an operation mode of toggling only chip enable signal CE# is not performed. Consequently, by toggling only chip enable signal CE# only on completion of the test mode, the test mode can be completed with reliability.

The test mode may be completed by setting state control circuit 22 shown in FIG. 1 into a reset state in accordance with the output signal of AND circuit 79 shown in FIG. 22.

Set/reset flip flop 78 may be reset in response to the falling of chip enable signal CE#.

Even in the case where chip enable signal CE# is fixed at the L level in the test mode, chip enable signal CE# is set to the H level upon completion of the test mode, and therefore, set/reset flip flop 78 can be set into the reset state.

As described above, according to the seventh embodiment of the invention, the test mode is completed by toggling the chip enable signal under the state where the write enable signal and the output enable signal are held in the inactive state of the H level. Thus, the test mode can be easily and reliably completed.

Other Modifications

Although the SRAM alternative memory has been described in the foregoing, the present invention can be also applied to a normal SRAM. The present invention can be also applied to a normal DRAM and a flash erasure type EEPROM (Electrically Erasable Programmable ROM) or a flash memory.

Although the test mode entry operation has been described in the foregoing, the operating sequence can be also used for a mode for designating a specific operation mode or a specific internal state.

As described above, according to the invention, when an external signal satisfies a predetermined condition, it is set so that a specific operation is designated. A specific operation can be accurately designated without exerting an adverse influence on the normal operation mode.

Although the present invention has been described and shown in detail, it is clearly understood that the same is by way of illustration and example only and is not to be taken by way of limitation, the spirit and scope of the present invention being limited only by the terms of the appended claims.

What is claimed is:

1. A semiconductor device comprising:
   determining circuitry receiving an external signal and determining whether said external signal satisfies a predetermined condition; and
   internal state setting circuitry made active when a determination result of said determining circuitry indicates that said predetermined condition is satisfied, for setting, in accordance with an internal state designation signal for designating a specific operation content, an internal state to a state designated by said internal state designation signal.

2. The semiconductor device according to claim 1, wherein said determining circuitry determines that said predetermined condition is satisfied when said external signal is applied in a predetermined state a predetermined number of times successively.

3. The semiconductor device according to claim 1, wherein said determining circuitry determines that said predetermined condition is satisfied when a multi-bit signal of multi bits as said external signal in a predetermined pattern applied a predetermined number of times successively.

4. The semiconductor device according to claim 1, wherein said determining circuitry determines that said predetermined condition is satisfied when a multi-bit signal of multi bits as said external signal is applied in a different predetermined pattern in a predetermined sequence a predetermined number of times successively.

5. The semiconductor device according to claim 1, wherein said determining circuitry determines whether said predetermined condition is satisfied in accordance with an externally applied signal at a normal voltage level and another externally signal of a super power source voltage level higher than said normal voltage level.

6. The semiconductor device according to claim 1, wherein said determining circuitry comprises:

a high voltage detecting circuit for detecting whether an externally applied signal having a voltage level higher than a normal power source voltage is applied as the external signal;
   an activation circuit receiving a first external signal as the external signal, for detecting whether the first external signal satisfies a first predetermined condition and activating said high voltage detecting circuit in accordance with a result of detection; and
   a mode determining circuit receiving a second external signal as the external signal, for detecting whether the second external signal satisfies a second predetermined condition in accordance with an output signal of said high voltage detecting circuit, and
   said internal state setting circuitry is enabled in accordance with an output signal of said mode determining circuit.

7. The semiconductor device according to claim 6, wherein said high voltage detecting circuit is disabled when said internal state is set by said internal state setting circuitry.

8. The semiconductor device according to claim 1, wherein said internal state setting circuitry receive external signals indicative of a plurality of operation contents over a plurality number of times successively, for setting the internal state to a state according to the operation contents when activated.

9. The semiconductor device according to claim 1, wherein said determining circuitry is made inactive when a predetermined signal condition is satisfied by the external signal.

10. The semiconductor device according to claim 1, wherein said semiconductor device is a semiconductor memory device including a plurality of memory cells, and wherein
    said determining circuitry receives a chip enable signal instructing that said semiconductor memory device is selected, a write enable signal for instructing a data writing mode of said semiconductor memory device, and an output enable signal for instructing a data output mode of said semiconductor memory device as said external signal, and is made inactive when said chip enable signal is toggled under a state where both said write enable signal and said output enable signal are held in an inactive state.

11. The semiconductor device according to claim 1, wherein said semiconductor device is a semiconductor memory device including a plurality of memory cells, and wherein
    said semiconductor device further comprises access circuitry for accessing data in said plurality of memory cells under a state where said determining circuitry is held in an active state in accordance with a chip enable signal instructing that said semiconductor memory device is selected, a write enable signal for instructing a data writing mode of said semiconductor memory device, and an output enable signal for instructing a data output mode of said semiconductor memory device.

12. The semiconductor device according to claim 1, wherein said predetermined operation is a test mode operation for testing said semiconductor device, said test mode is set in accordance with an output signal of said determining circuitry, to allow a test content to be performed in the test mode to set.

13. The semiconductor device according to claim 12, wherein said internal state setting circuitry sets a plurality of test contents simultaneously in accordance with an external signal as said internal state designating signal.

14. The semiconductor device according to claim 13, wherein upon setting said test mode, said internal state setting circuitry sets test contents in accordance with external signals externally applied over a plurality of setting cycles, while setting tests having operation contents non-conflictive to each other in each setting cycle.

15. The semiconductor device according to claim 14, wherein said test mode is set by the use of a multi-bit signal of multi bits, kinds of the tests are grouped according to bits of said multi-bit signal, and said internal state setting circuitry includes a circuit for inhibiting designation of a further test by a common signal bit after one test is set in a group.

16. The semiconductor device according to claim 15, wherein said semiconductor device is a semiconductor memory device including a plurality of memory cells, and said multi-bit signal is an address signal designating an address of a memory cell of said plurality of memory cells.

* * * * *